US008322403B2

(12) United States Patent  
Lin et al.

(10) Patent No.: US 8,322,403 B2
(45) Date of Patent: Dec. 4, 2012

(54) FIXING ASSEMBLY FOR HEAT-ABSORBING SURFACES OF JUXTAPOSED HEAT PIPES AND HEAT SINK HAVING THE SAME

(75) Inventors: Kuo-Len Lin, Wugu Township, Taipei County (TW); Chen-Hsiang Lin, Wugu Township, Taipei County (TW); Ken Hsu, Wugu Township, Taipei County (TW); Chih-Hung Cheng, Wugu Township, Taipei County (TW)

(73) Assignees: Cpumate Inc., New Taipei (TW); Golden Sun News Techniques Co., Ltd., New Taipei (TW)

( * ) Notice: Subject to any disclaimer, the term of this patent is extended or adjusted under 35 U.S.C. 154(b) by 685 days.

(21) Appl. No.: 12/554,864

(22) Filed: Sep. 4, 2009

(65) Prior Publication Data

US 2011/0056657 A1   Mar. 10, 2011

(51) Int. Cl.
*F28D 15/02* (2006.01)
(52) U.S. Cl. ........................ 165/80.2; 361/700
(58) Field of Classification Search .............. 165/78, 165/80.2, 80.3, 104.26, 104.33, 181; 361/700
See application file for complete search history.

(56) References Cited

U.S. PATENT DOCUMENTS

| 7,093,648 | B1 | 8/2006 | Cheng |
| 8,191,612 | B2 * | 6/2012 | Huang ........................ 165/80.3 |
| 2005/0067144 | A1 | 3/2005 | Chou |
| 2005/0263265 | A1 * | 12/2005 | Sheng et al. ............. 165/104.21 |
| 2007/0151711 | A1 | 7/2007 | Chen et al. |
| 2007/0267181 | A1 | 11/2007 | Lin et al. |

FOREIGN PATENT DOCUMENTS

TW           M349179           1/2009

OTHER PUBLICATIONS

European research report Feb. 22, 2010.

* cited by examiner

*Primary Examiner* — Teresa Walberg
(74) *Attorney, Agent, or Firm* — Chun-Ming Shih; HDLS IPR Services

(57) ABSTRACT

A heat sink includes a fixing base, a plurality of heat pipes and a fixing body. The bottom surface of the fixing base is provided with a connecting plane and extends upwards to form a fixing arm. The fixing arm is provided with a plurality of first grooves. The fixing body is provided with a plurality of second grooves and combined with the fixing arm. The second grooves correspond to the first grooves for cooperatively receiving and clamping the upper edges of the evaporating sections of the heat pipes. The evaporating section of the heat pipe is provided with a contacting plane and an adhering plane. The contacting planes of the evaporating sections are adjacent to each other and the evaporating sections are fixed to the connecting plane of the fixing base. With this arrangement, the juxtaposed heat pipes can be assembled with the fixing base. Further, the condensing section of the heat pipe penetrates a plurality of fins to form the heat sink.

20 Claims, 6 Drawing Sheets

FIXING ASSEMBLY FOR HEAT-ABSORBING SURFACES OF JUXTAPOSED HEAT PIPES AND HEAT SINK HAVING THE SAME

BACKGROUND OF THE INVENTION

1. Field of the Invention

The present invention relates to a heat-conducting structure, and in particular to a combination of heat pipes and a heat-conducting base.

2. Description of Prior Art

Taiwan Patent Publication No. M349179 discloses a conventional heat sink having juxtaposed heat pipes, which includes a heat-dissipating body, a heat-conducting base and a plurality of heat pipes. The heat-dissipating body is formed by stacking a plurality of heat-dissipating pieces. The heat pipe has a heat-absorbing end and a condensing end. Each of the heat-dissipating pieces is provided with through-holes. The condensing section of the heat pipe penetrates the thorough-hole of each heat-dissipating piece. The heat-conducting block is provided with a plurality of troughs in which the heat-absorbing ends of the heat pipes can be juxtaposed.

Before the heat-absorbing end of the heat pipe is disposed in the trough, a metallic material of a low melting point has to be applied to the interior of the trough. Then, the heat-absorbing end of the heat pipe is disposed in the trough. Finally, the heat pipe is put into a soldering furnace, so that the applied metallic material can be heated and melted to secure the heat pipe to the heat-conducting block. In this way, a heat sink having heat pipes can be formed. However, the surface of the heat pipe may become black due to the heating of the soldering furnace. As a result, another reduction-and-oxidization (abbreviated as "redox" hereinafter) process has to be executed, thereby making the surface of the heat pipe to return its original color.

The process of manufacturing the above-mentioned heat sink involves the production cost and material cost resulted from the steps of applying and melting heat-conducting medium. Furthermore, during the combination of the heat pipe with the heat-conducting block, the surface of the heat pipe becomes block due to the heating and melting steps of the soldering furnace. As a result, it is necessary to execute another redox process to make the surface of the heat pipe to return its original color, which causes additional cost.

Thus, in order to eliminate the heating and melting steps used in the conventional process, a pressing step is proposed, whereby the juxtaposed heat pipes can be compressed in a trough of the heat-conducting block. However, the step of pressing the heat pipe into the heat-conducting block is more complicated. Also, the surface of the heat pipe after pressing may suffer damage easily, which affects the yield and lifetime of the heat sink. Furthermore, when the heat sink is transported to another place, the heat pipes inserted into the heat-conducting block may be displaced easily due to external forces.

Therefore, in order to solve the above-mentioned problems, the present Inventor proposes a reasonable and novel structure based on his deliberate research and expert experiences.

SUMMARY OF THE INVENTION

The present invention is to provide a fixing assembly for heat-absorbing surfaces of juxtaposed heat pipes, whereby the step of combining the heat pipes with a fixing base can be simplified, and thus the production cost and time can be reduced.

The present invention is to provide a fixing assembly for heat-absorbing surfaces of juxtaposed heat pipes, whereby the integrity of the external appearance of the evaporating section of the heat pipe can be maintained, and the yield and lifetime of the heat pipe can be increased.

The present invention provides a fixing assembly for heat-absorbing surfaces of juxtaposed heat pipes, whereby the displacement of the heat pipe caused by external forces can be prevented.

The present invention provides a fixing assembly for heat-absorbing surfaces of juxtaposed heat pipes, which includes a fixing base, a plurality of heat pipes and a fixing body. A bottom surface of the fixing base is provided with a connecting plane. The fixing base extends upwards to form a fixing arm. The fixing arm is provided with a plurality of first grooves. The heat pipe has an evaporating section provided with a contacting plane and an adhering plane. The evaporating sections of the heat pipes are adjacent to each other with their respective contacting planes, and the evaporating sections are fixed to the connecting plane of the fixing base. An upper edge of the evaporating section of the heat pipe is received in the first groove of the fixing arm. The fixing body is combined with the fixing arm. The fixing body is provided with a plurality of second grooves. The second grooves correspond to the first grooves for cooperatively receiving and clamping the upper edges of the evaporating sections of the heat pipes.

The present invention provides a heat sink having a fixing assembly for heat-absorbing surfaces of juxtaposed heat pipes, which includes a fixing base, a plurality of heat pipes, a plurality of fins and a fixing body. A bottom surface of the fixing base is provided with a connecting plane. The fixing base extends upwards to form a fixing arm. The fixing arm is provided with a plurality of first grooves. The heat pipe has an evaporating section and a condensing section. The evaporating section is provided with a contacting plane and an adhering plane. The evaporating sections of the heat pipes are adjacent to each other with their respective contacting planes, and the evaporating sections are fixed to the connecting plane of the fixing base. An upper edge of the evaporating section of the heat pipe is received in the first groove of the fixing arm. The condensing section of the heat pipe penetrates the parallel fins. The fixing body is combined with the fixing arm. The fixing body is provided with a plurality of second grooves. The second grooves correspond to the first grooves for cooperatively receiving and clamping the upper edges of the evaporating sections of the heat pipes.

In comparison with prior art, according to the present invention, the evaporating section of the heat pipe is formed with a contacting plane and an adhering plane, and the evaporating sections of the heat pipes are adjacent to each other and juxtaposed in the fixing base. A fixing arm extends from the fixing base for receiving the upper edge of the evaporating section of the heat pipe. Further, the fixing body is connected to the fixing arm by screw elements, thereby positioning the heat pipe. In this way, the conventional step of fixing the heat pipes by means of melting or pressing can be replaced. Thus, the combining step of the heat pipes with the fixing base can be simplified, and the yield and lifetime of the heat sink having such heat pipes can be increased.

DETAILED DESCRIPTION OF THE INVENTION

The characteristics and technical contents of the present invention will be described with reference to the accompanying drawings. However, the drawings are illustrative only but not used to limit the present invention.

Figure 1:
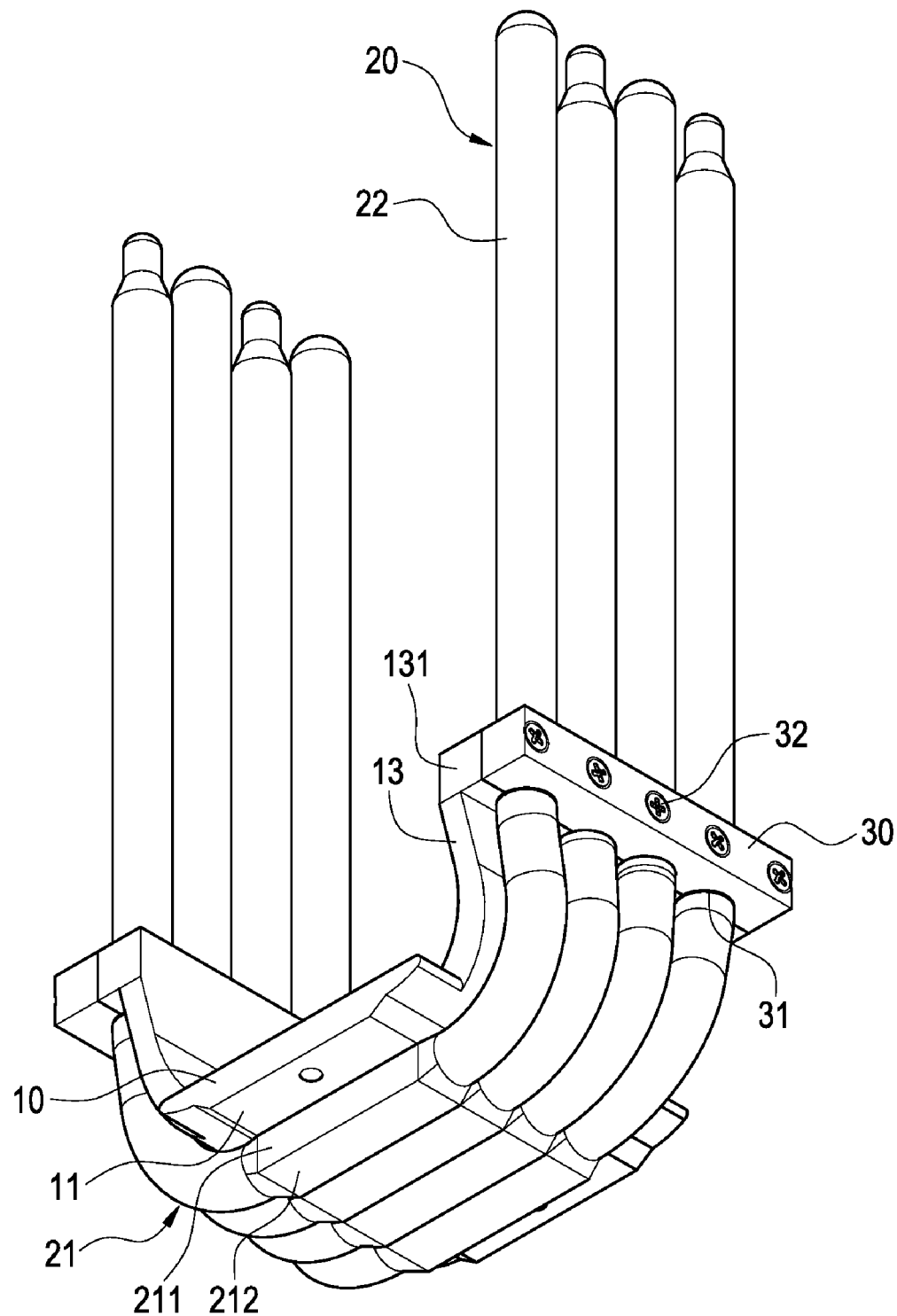
FIG. 1 is a schematic view showing the external appearance of the present invention.
Figure 2:
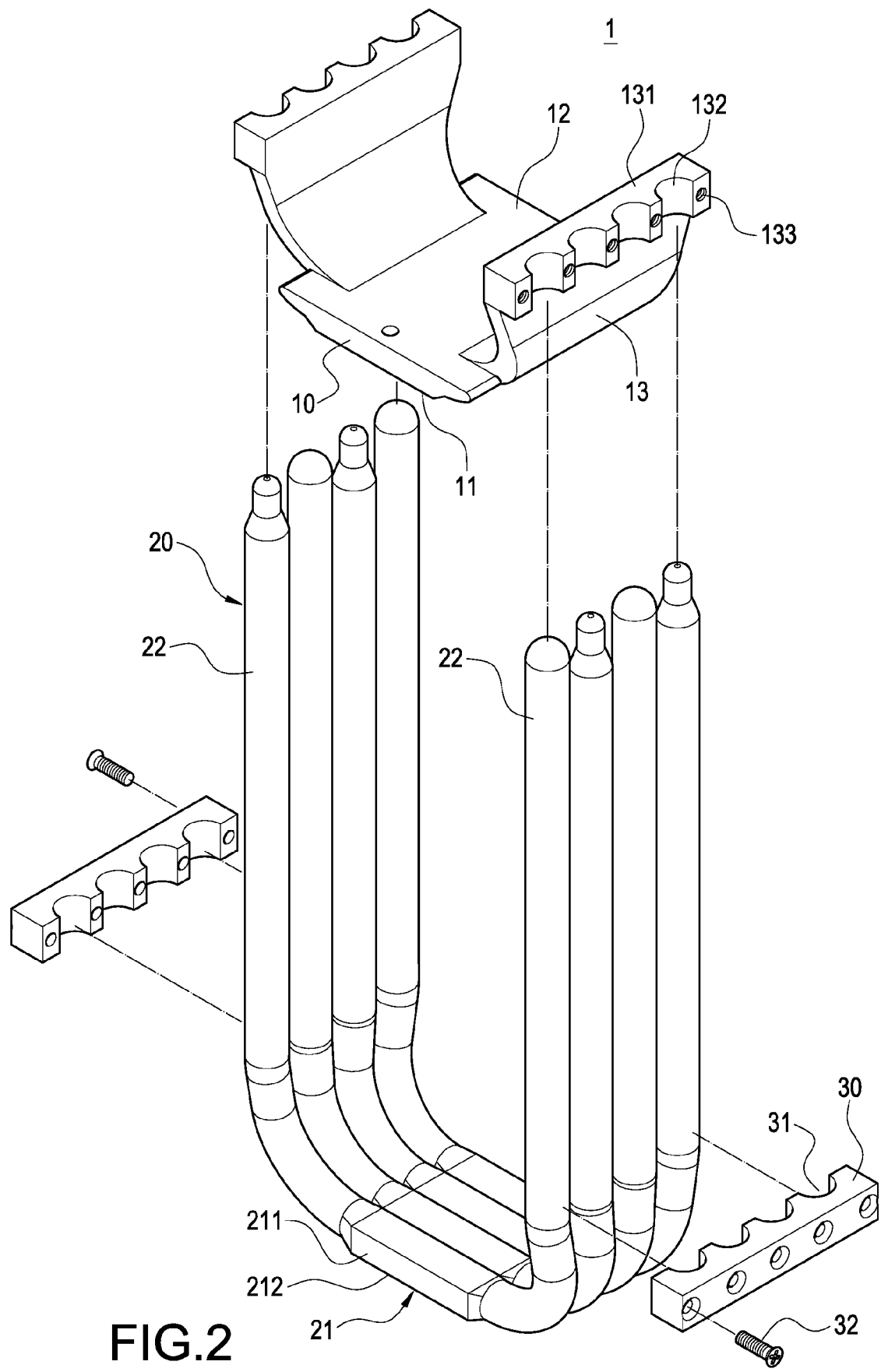
FIG. 2 is an exploded perspective view of the present invention.
Figure 3:
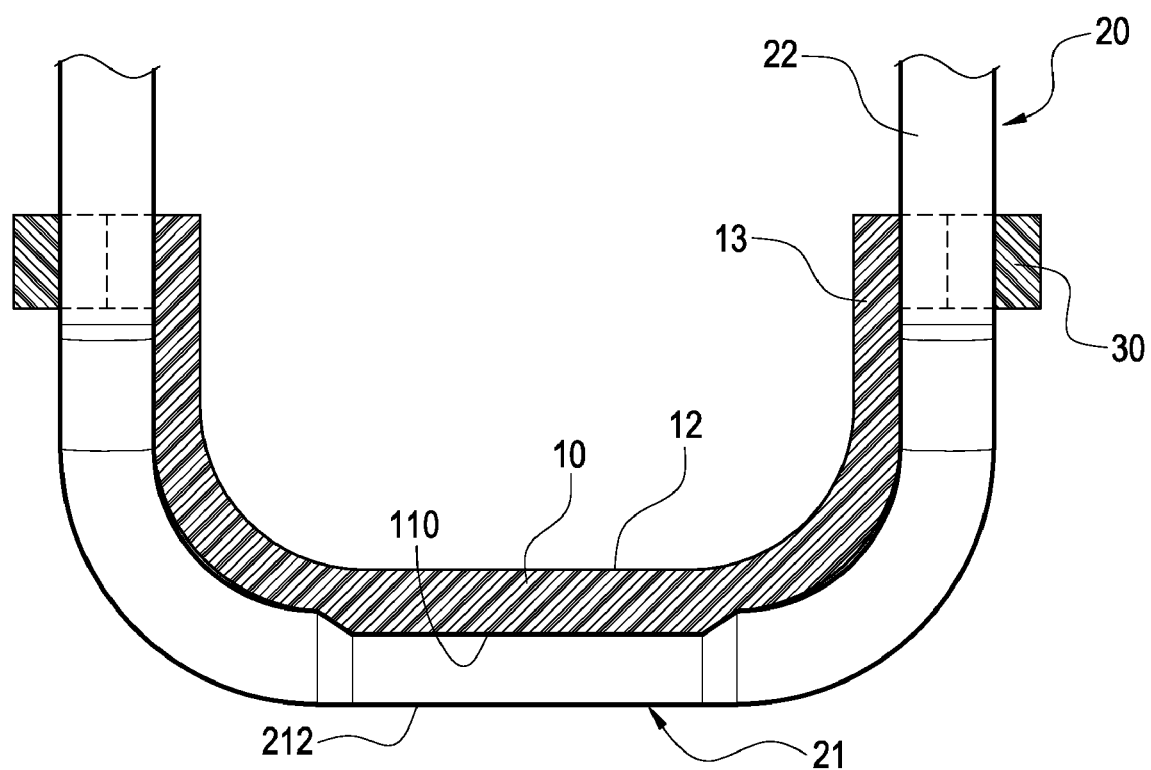
FIG. 3 is an assembled cross-sectional view showing one side of the present invention.
Figure 4:
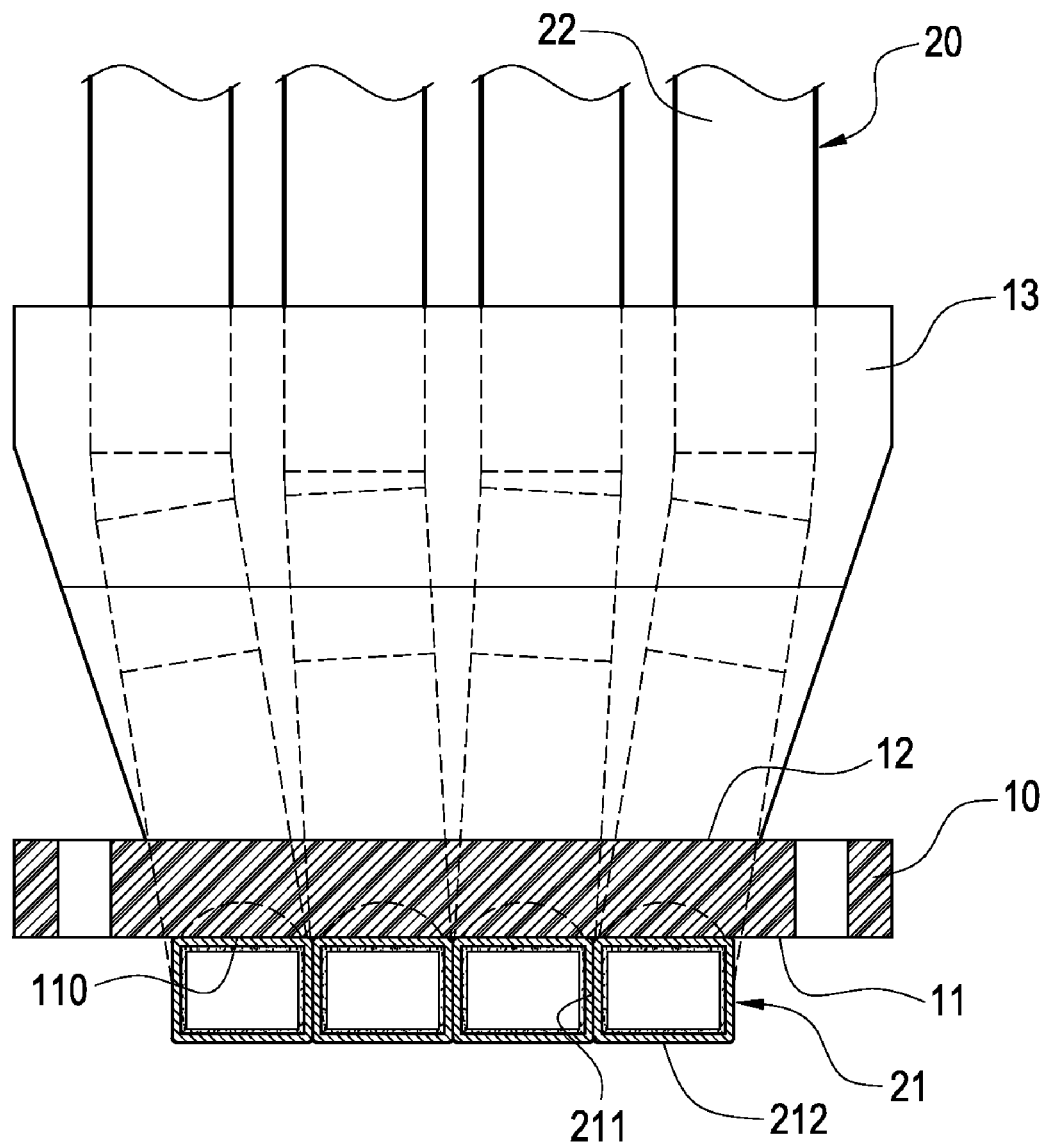
FIG. 4 is an assembled cross-sectional view showing another side of the present invention.

Please refer to FIGS. 1 to 4. FIG. 1 is a schematic view showing the external appearance of the present invention. FIG. 2 is an exploded perspective view of the present invention. FIGS. 3 and 4 are two assembled cross-sectional views of the present invention. The present invention provides a fixing assembly for heat-absorbing surfaces of juxtaposed heat pipes, which includes a fixing base 10, a plurality of heat pipes 20 and a fixing body 30.

The bottom surface 11 of the fixing base 10 is provided with a connecting plane 110. Both sides of the top surface 12 of the fixing base 10 extend upwards to form a fixing arm 13 respectively. That is, the fixing base 10 and the two fixing arms 13 are integrally formed into a U shape. The distal end of the fixing arm 13 extends outwards and vertically to form a protruding plate 131. The protruding plate 131 is provided with a plurality of first grooves 132.

Each of the heat pipes 20 is formed into a U shape and has an evaporating section 21 and two condensing sections 22. The evaporating section 21 is provided with a contacting plane 211 and an adhering plane 212. In the present embodiment, the cross section of the evaporating section 21 of the heat pipe 20 is rectangular. The evaporating sections 21 of the heat pipes 20 are juxtaposed with their contacting planes 211 adjacent to each other, and the evaporating sections 21 are fixed to the connecting plane 110 of the fixing base 10. The adhering planes 212 of the evaporating sections 21 are in flush with each other, so that a heat-generating electronic element can be adhered thereto. Further, heat-conducting paste or heat-conducting glue can be applied between the evaporating sections 21 of the heat pipes 20, thereby increasing the heat-conducting effect of the adjacent heat pipes 20.

After the evaporating section 21 of the heat pipe 20 is adhered to the bottom surface of the fixing base 10, the upper edge of the evaporating section 21 of the heat pipe 20 is received in the first groove 132 of the fixing arm 13. Then, the fixing arm 13 is combined with the fixing body 30. The fixing body 30 is provided with a plurality of second grooves 31. The second grooves 31 correspond to the first grooves 132 of the fixing arm 13 for cooperatively receiving and clamping the upper edges of the evaporating sections 21 of the heat pipes 20. The protruding plate 131 of the distal end of the fixing arm 13 is provided with a plurality of connecting holes 133. The fixing body 30 is provided with a plurality of screw holes corresponding to the connecting holes 133. A plurality of screw elements 32 penetrates the connecting holes 133 and the screw holes respectively, thereby connecting the fixing body 30 to the protruding plate 131 of the fixing arm 13.

After the fixing body 30 and the fixing arm 13 are connected to each other by means of the screw elements 32, the upper edges of the evaporating sections 21 of the heat pipes 20 are clamped and fixed to the fixing arm 13. Thus, the evaporating sections 21 of the heat pipes 20 can be positioned on the connecting plane 110 of the fixing base 10, thereby keeping the thermal contact between the evaporating sections 21 of the heat pipes 20 and the fixing base 10.

Figure 5:
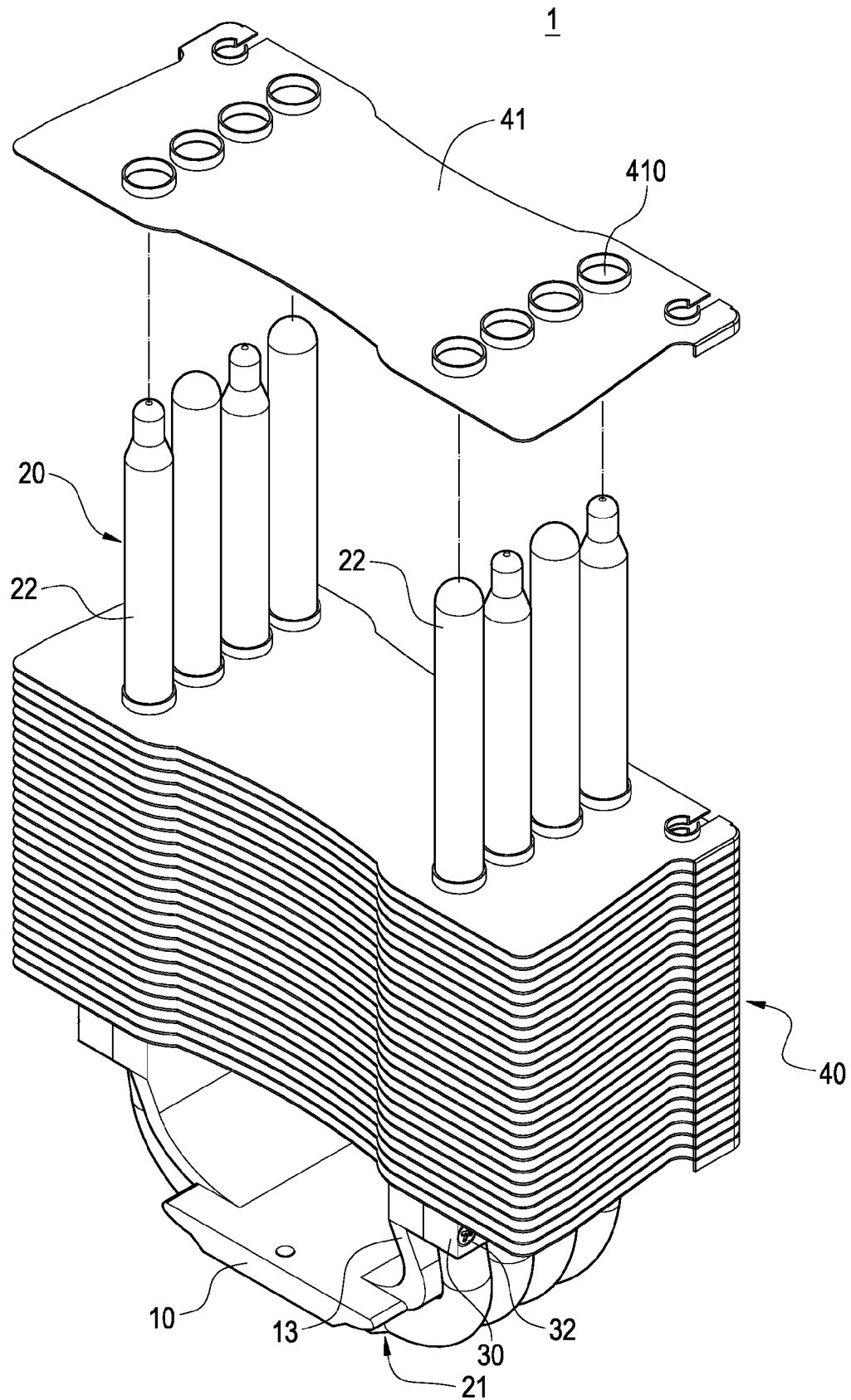
FIG. 5 is a schematic view showing the combination of the present invention with the heat-dissipating fins.

Please refer to FIG. 5. After the heat pipes 20 are assembled with the fixing base 10 and the fixing body 30, the condensing sections 22 of the heat pipes 20 are combined with a plurality of fins 41 to form a heat sink 1. Each of the fins 41 is provided with a plurality of through-holes 410. With the through-holes 410, the condensing sections 22 of the heat pipes 20 can penetrate the respective fins 41 to form a set 40 of heat-dissipating fins, thereby increasing the heat-dissipating area of the heat sink 1 to dissipate the heat rapidly.

Figure 6:
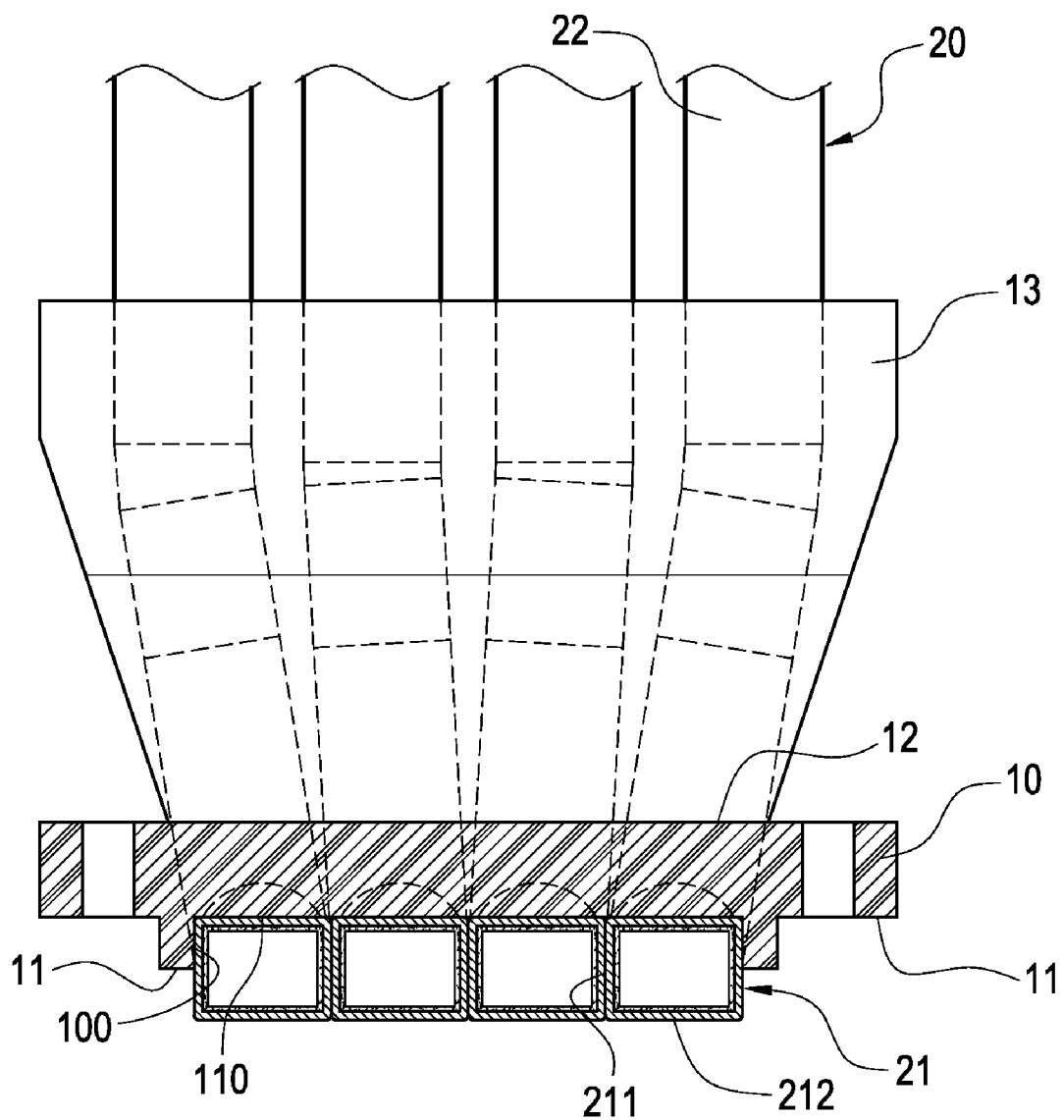
FIG. 6 is a view showing the second embodiment of the present invention.

Please refer to FIG. 6, which shows a second embodiment of the fixing assembly for heat-absorbing surfaces of juxtaposed heat pipes according to the present invention. The second embodiment is substantially identical to the first embodiment, but the only difference there between lies in that: the bottom surface 11 of the fixing base 10 is provided with an accommodating trough 100. The top surface of the accommodating trough 100 is the connecting plane 110. The evaporating sections 21 of the heat pipes 20 are juxtaposed and received in the accommodating trough 100. The contacting planes 211 of the evaporating sections 21 are adjacent to each other. The adhering planes 212 used to be adhered to the heat-generating element may protrude from the accommodating trough 100 or be in flush with the accommodating trough 100.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A fixing assembly for heat-absorbing surfaces of juxtaposed heat pipes, comprising:
    a fixing base with its bottom surface having a connecting plane, the fixing base extending upwards from a top surface thereof to form a fixing arm, the fixing arm being provided with a plurality of first grooves;
    a plurality of heat pipes each having an evaporating section, the evaporating section being provided with a contacting plane and an adhering plane, evaporating sections of the heat pipes being adjacent to each other with respective contacting planes, the evaporating sections being located beneath the fixing base and fixed to the connecting plane of the fixing base, an upper edge of the evaporating section of the heat pipe being received in one of the first grooves of the fixing arm; and
    a fixing body combined with the fixing arm, the fixing body being provided with a plurality of second grooves, the second grooves corresponding to the first grooves for cooperatively receiving and clamping upper edges of the evaporating sections of the heat pipes.

2. The fixing assembly for heat-absorbing surfaces of juxtaposed heat pipes according to claim 1, wherein each heat pipe is formed into a U shape and has two condensing sections, both sides of the fixing base extend upwards to form the fixing arm respectively, and the two condensing sections are received in the two fixing arms respectively.

3. The fixing assembly for heat-absorbing surfaces of juxtaposed heat pipes according to claim 2, wherein the fixing base and the two fixing arms together form a U shape, and the fixing base is integrally formed with the two fixing arms.

4. The fixing assembly for heat-absorbing surfaces of juxtaposed heat pipes according to claim 2, wherein a distal end of the fixing arm extends outwards and vertically to form a protruding plate, and the protruding plate is provided with the first grooves.

5. The fixing assembly for heat-absorbing surfaces of juxtaposed heat pipes according to claim 1, wherein the fixing arm is provided with a plurality of connecting holes, the fixing body is provided with a plurality of screw holes to correspond to the connecting holes.

6. The fixing assembly for heat-absorbing surfaces of juxtaposed heat pipes according to claim 1, wherein the bottom surface of the fixing base is provided with an accommodating trough, and the top surface of the accommodating trough is the connecting plane.

7. The fixing assembly for heat-absorbing surfaces of juxtaposed heat pipes according to claim 6, wherein the evaporating sections of the heat pipes are received in the accommodating trough, and the adhering plane protrudes from the accommodating trough.

8. The fixing assembly for heat-absorbing surfaces of juxtaposed heat pipes according to claim 1, wherein the evaporating sections of the heat pipes are juxtaposed and fixed to the connecting plane of the fixing base, and the adhering planes of the evaporating sections are in flush with each other.

9. The fixing assembly for heat-absorbing surfaces of juxtaposed heat pipes according to claim 1, wherein a cross section of the evaporating section of the heat pipe is rectangular.

10. The fixing assembly for heat-absorbing surfaces of juxtaposed heat pipes according to claim 1, wherein the evaporating section of the heat pipe is applied with heat-conducting paste.

11. A heat sink having a fixing assembly for heat-absorbing surfaces of juxtaposed heat pipes, comprising:
a fixing base with its bottom surface having a connecting plane, the fixing base extending upwards from a top surface thereof to form a fixing arm, the fixing arm being provided with a plurality of first grooves;
a plurality of heat pipes each having an evaporating section and a condensing section, the evaporating section being provided with a contacting plane and an adhering plane, the evaporating sections of the heat pipes being adjacent to each other with respective contacting planes, the evaporating sections being located beneath the fixing base and fixed to the connecting plane of the fixing base, an upper edge of the evaporating section of the heat pipe being received in the first groove of the fixing arm;
a plurality of fins arranged parallel and penetrated by the condensing sections of the heat pipes; and
a fixing body combined with the fixing arm, the fixing body being provided with a plurality of second grooves, the second grooves corresponding to the first grooves for cooperatively receiving and clamping the upper edges of the evaporating sections of the heat pipes.

12. The heat sink having a fixing assembly for heat-absorbing surfaces of juxtaposed heat pipes according to claim 11, wherein the heat pipe is formed into a U shape and has two condensing sections, both sides of the fixing base extend upwards to form the fixing arm respectively, and the two condensing sections are received in the two fixing arms respectively.

13. The heat sink having a fixing assembly for heat-absorbing surfaces of juxtaposed heat pipes according to claim 12, wherein the fixing base and the two fixing arms form a U shape, and the fixing base is integrally formed with the two fixing arms.

14. The heat sink having a fixing assembly for heat-absorbing surfaces of juxtaposed heat pipes according to claim 12, wherein a distal end of the fixing arm extends outwards and vertically to form a protruding plate, the protruding plate is provided with the plurality of first grooves.

15. The heat sink having a fixing assembly for heat-absorbing surfaces of juxtaposed heat pipes according to claim 11, wherein the fixing arm is provided with a plurality of connecting holes, and the fixing body is provided with a plurality of screw holes corresponding to the connecting holes.

16. The heat sink having a fixing assembly for heat-absorbing surfaces of juxtaposed heat pipes according to claim 11, wherein the bottom surface of the fixing base is provided with an accommodating trough, and the top surface of the accommodating trough is the connecting plane.

17. The heat sink having a fixing assembly for heat-absorbing surfaces of juxtaposed heat pipes according to claim 11, wherein the evaporating sections of the heat pipes are received in the accommodating trough, and the adhering plane protrudes from the accommodating trough.

18. The heat sink having a fixing assembly for heat-absorbing surfaces of juxtaposed heat pipes according to claim 11, wherein the evaporating sections of the heat pipes are juxtaposed and fixed to the connecting plane of the fixing base, and the adhering planes of the evaporating sections are in flush with each other.

19. The heat sink having a fixing assembly for heat-absorbing surfaces of juxtaposed heat pipes according to claim 11, wherein a cross section of the evaporating section of the heat pipe is rectangular.

20. The heat sink having a fixing assembly for heat-absorbing surfaces of juxtaposed heat pipes according to claim 11, wherein the evaporating section of the heat pipe is applied with heat-conducting paste.

* * * * *